United States Patent [19]
Suntola et al.

[11] Patent Number: 5,711,811
[45] Date of Patent: Jan. 27, 1998

[54] METHOD AND EQUIPMENT FOR GROWING THIN FILMS

[75] Inventors: Tuomo Suntola; Sven Lindfors, both of Espoo; Pekka Soininen, Helsinki, all of Finland

[73] Assignee: Mikrokemia Oy, Espoo, Finland

[21] Appl. No.: 682,703

[22] PCT Filed: Nov. 28, 1995

[86] PCT No.: PCT/FI95/00659

§ 371 Date: Oct. 2, 1996

§ 102(e) Date: Oct. 2, 1996

[87] PCT Pub. No.: WO96/17969

PCT Pub. Date: Jun. 13, 1996

[30] Foreign Application Priority Data

Nov. 28, 1994 [FI] Finland .................... 945612

[51] Int. Cl.$^6$ .................... C23C 16/00
[52] U.S. Cl. .................... 118/711; 118/725; 118/715
[58] Field of Search .................... 118/719, 725, 118/715

[56] References Cited

U.S. PATENT DOCUMENTS

| | | | |
|---|---|---|---|
| 3,730,696 | 5/1973 | Pointu et al. ............... | 118/719 |
| 4,058,430 | 11/1977 | Suntola et al. ............... | 156/611 |
| 4,062,318 | 12/1977 | Ban et al. ............... | 118/49 |
| 4,263,872 | 4/1981 | Ban ............... | 118/721 |
| 4,339,645 | 7/1982 | Miller ............... | 219/10.49 R |
| 4,389,973 | 6/1983 | Suntola et al. ............... | 118/725 |
| 4,413,022 | 11/1983 | Suntola et al. ............... | 427/225.2 |
| 4,421,786 | 12/1983 | Mahajan et al. ............... | 427/82 |
| 4,825,806 | 5/1989 | Tawada et al. ............... | 118/719 |
| 4,993,357 | 2/1991 | Scholz ............... | 118/715 |
| 5,038,711 | 8/1991 | Dan et al. ............... | 118/715 |
| 5,091,335 | 2/1992 | Grunthaner et al. ............... | 117/86 |
| 5,183,510 | 2/1993 | Kimura ............... | 118/719 |

FOREIGN PATENT DOCUMENTS

| | | |
|---|---|---|
| 0 015 390 A1 | 9/1980 | European Pat. Off. . |
| 0015390 A1 | 9/1980 | European Pat. Off. . |
| 0559326 A1 | 9/1993 | European Pat. Off. . |
| 31 48 620 C2 | 5/1986 | Germany . |
| 37 39 528 A1 | 6/1989 | Germany . |
| 39 36 016 A1 | 5/1991 | Germany . |
| 59-111997 | 6/1984 | Japan . |
| 61-26217 | 2/1986 | Japan ............... 118/719 |
| 61-289623 | 12/1986 | Japan ............... 118/719 |
| 63-112495 | 5/1988 | Japan . |

OTHER PUBLICATIONS

R.R. Garnache and D. M. Kenney, Deposit and Clean Deposition System, IBM Technical Disclosure Bulletin, p. 2083, Dec. 1970.

Suntola, Tuomo, "Atomic layer epitaxy," Thin Solid Films, vol. 216, pp. 84–89, 1992.

*Primary Examiner*—R. Bruce Breneman
*Assistant Examiner*—Jeffrie R. Lund
*Attorney, Agent, or Firm*—Sterne, Kessler, Goldstein & Fox, PLLC

[57] ABSTRACT

The invention relates to equipment for growing a thin film onto a substrate. The equipment suited to implement the invention comprises a reaction space having a reaction chamber therein into which a substrate is placed and is subjected to alternately repeated surface reactions of at least two vapor-phase reactants for the purpose of forming a thin film. The equipment further comprises recesses/openings communicating with the reaction space to form gas inflow and outflow channels. The reactants are fed in the form of vapor-phase pulses repeatedly and alternately into the reaction space through the inflow channels, each reactant separately from its own source. The vapor-phase reactants are brought to react with the surface of the substrate for the purpose of forming a solid-state thin film compound on said substrate. The gaseous reaction products and possible excess reactants are removed in gas phase from the reaction space via the outflow channels.

17 Claims, 3 Drawing Sheets

METHOD AND EQUIPMENT FOR GROWING THIN FILMS

BACKGROUND OF THE INVENTION

1. Field of the Invention

In the present method, a substrate located in a reaction space is subjected to alternately repeated surface reactions of at least two different reactants employed in the thin-film growth process. In the method, the reactants are admitted in vapor-phase repetitively and alternately each reactant from its own source into the reaction space, where the reactants are allowed to react with the substrate surface for the purpose of forming a solid-state thin film on the substrate. Reaction products not adhering to the substrate as well as possible excess reactants are removed in gas phase from the reaction space.

2. Related Art

Conventionally, thin-films are grown using vacuum evaporation deposition, the Molecular Beam Epitaxy (MBE) and other similar vacuum deposition methods, different variants of the Chemical Vapor Deposition (CVD) method (including low-pressure and metal-organic CVD and plasma-enhanced CVD), or alternatively, the above-described deposition method of alternately repeated surface reactions called the Atomic Layer Epitaxy (ALE) method. In the MBE and CVD methods, besides other process variables, the thin-film growth rate is also affected by the concentrations of the precursor inflows. To achieve a uniform thickness of the layers deposited by the first category of conventional methods, the concentrations and reactivities of precursors must hence be carefully kept constant all over the substrate area. If the different precursors are allowed to mix with each other prior to reaching the substrate surface as is the case in the CVD method, for instance, a chance of their premature mutual reaction arises. Then, the risk of microparticle formation already within the inflow channels of the gaseous reactants is imminent. Such microparticles generally have a deteriorating effect on the quality of the thin film. Therefore, the possibility of premature reactions in MBE and CVD reactors is avoided by heating the precursors no earlier than at the substrate surfaces. In addition to heating, the desired reaction can be initiated using, e.g., a plasma or other similar activating means.

In the MBE and CVD processes, the growth of thin films is primarily adjusted by controlling the inflow rates of precursors impinging tin the substrate. By contrast, the ALE process is based on allowing the substrate surface qualities rather than the precursor concentrations or flow variables to control the deposition rate. The only prerequisite in the ALE process is that the precursor is available in sufficient concentration for thin-film formation on all sides of the substrate.

The ALE method is described in the FI patent publications 52,359 and 57,975 and in the U.S. Pat. No. 4,058,430 and 4,389,973, in which also some equipment embodiments suited for implementing this method are disclosed. Equipment constructions for growing thin films are also to be found in the following publications: Material Science Reports 4(7) (1989), p. 261, and Tyhjiötekniikka (Finnish publication for vacuum techniques), ISBN 951-794-422-5, pp. 253–261.

In the ALE growth method, atoms or molecules are arranged to sweep over the substrates thus continuously impinging on their surface so that a fully saturated molecular layer is formed thereon. According to the conventional techniques known from the FI patent publication No. 57,975, the saturation step is followed by an inert gas pulse forming a diffusion barrier which sweeps away the excess precursor and the gaseous reaction products from above the substrate. The successive pulses of different precursors and of diffusion barriers of an inert gas separating the former accomplish the growth of the thin film at a rate controlled by the surface kinetics of the different materials. Such a reactor is called a "traveling-wave" reactor. For the function of the process it is irrelevant whether the gases or the substrates are moved, but rather, it is imperative that the different precursors of the successive reaction steps are separated from each other and arranged to impinge on the substrate successively.

Most vacuum evaporators operate on the so-called "single-shot" principle. Herein, a vaporized atom or molecule species can impinge on the substrate only once. If no reaction of the species with the substrate surface occurs, the species is bounced or re-vaporized so as to hit the equipment walls or the inlet to the vacuum pump undergoing condensation therein. In hot-wall reactors, an atom or molecule species impinging on the reactor wall or the substrate may become re-vaporized, whereby advantageous conditions are created for repeated impingements of the species on the substrate. When applied to ALE reactors, this "multi-shot" principle can provide, i.a., improved material utilization efficiency.

In the ALE thin-film growth process, if the precursors are due to reasons related to flow dynamics or other factors distributed unevenly over the area of the substrates, homogeneous growth or the thin film can only be assured by feeding such a massive amount of a precursor in each reagent pulse over the substrates that also at the point of the leanest flow, a sufficiently rich amount is introduced during each reactant pulse. However, in reflection to the fact that discontinuities in the flow geometry may cause concentration differences mounting up to several decades, unfavorable flow geometry may necessitate pulsing the precursors in amounts much above the level required by the thin-film growth itself. This kind of compensation is called overdosing, and it may also be dictated by other reasons such as the chemistry of the precursors.

To provide a precursor in the ALE growth process in sufficient amounts all over the substrate without resorting to large overdosing, two alternative approaches are employed to ensure uniform distribution of gases:

1. The equipment is constructed such that the pressure at the substrates is so low as to make the mean free path of the molecules, that is, the mean mutual collision distance against each other or the walls, greater than the spacing between the substrates. Then, a major portion of the gas molecule collisions is incident on the substrates and the molecules of the sparse gas can assume a homogeneous distribution over the substrates. When the mean free path is in the order of the typical distance d between the walls in the system, or at least $1/100$ thereof, the gas flow is said to be in the transition region occurring in the intermediate pressure range between viscous flow and molecular flow. At 1 mbar pressure and room temperature, the mean free path of a nitrogen molecule is 64 μm, and at 0.01 mbar pressure, 6.4 mm. In the ALE reactors, the mutual distances between the substrates are typically in the order of a few millimeters. Hence, when aiming at the above-described situation, the pressure must be approx. 1 mbar or preferably even lower.

2. The equipment is operated at a higher pressure, whereby the mean free path of the molecules becomes smaller and the gas flow is not in the transition region any more, but instead, becomes viscous (when the collision distance is smaller than d/100). In the viscous state, the gas flow takes place by a collective movement of the molecules, which are coupled to each other by frequent collisions, toward the direction of lower pressure. The mixing of the molecules by thermal motion is evidenced as their interdiffusion. In such equipment embodiments, the goal is to distribute the gas homogeneously over the substrates by means of different equalizing gas flow guides and nozzles as the diffusion velocities cross-directionally to the gas flow are small in relation to the velocity of the gas flow.

The former alternative is hampered by the low pressure required in equipment with realizable dimensions. When the pressure is reduced by a decade, also the volumetric capacity of the pump must be increased by a decade, whereby also the gas flow velocities increase by a decade if a constant mass flow rate is assumed. However, the velocity of sound sets an absolute limit to the gas flow velocity, and the prices of pumps easily become excessively high. Moreover, when lower pressures are used, the reactor dimensions must also be increased to improve gas transport so as not to cause pressure losses that would increase the internal pressure. However, this would again presume a further decrease of the operating pressure.

Pressure may also be decreased by using lower flow rates of reaction space purging and precursor transport. As the amounts or precursors to be transported remain unchanged and sufficient purging cycles must be applied, longer process times result. While this may not give rise to a complication in research reactors, the problem will be accentuated in production equipment and operation with large substrate areas.

In an embodiment according to the latter alternative, the operating pressure typically is in the order of 2–10 mbar, whereby the required pumps have a reasonable size, the dimensions of the piping and substrate holder still remain easily realizable and the gas flow times and velocities reasonable.

To distribute the gases homogeneously over the entire area of the substrates, different kinds of colliders and restrictors are used. In colliders, the gas stream is arranged to impinge on some surface which causes spreading and mixing of the gas stream. Furthermore, a number of such colliders can be arranged in series on the path of the gas flow. The function of in-parallel arranged restrictors in turn is based on designing the gas space itself on the ingoing side of the restrictions to have a flow conductance much larger than the conductance through each of the restrictions. Then, all the in-parallel arranged restrictions provide an equal path to the gas flow, causing the flow to assume a homogeneous linear or planar shape in passing through the restriction(s). The restrictions may be provided by, e.g., a narrow slit, a parallel line of bores (pipes), sintered material and other similar structures.

Even if the gas flow can be homogenized, practical problems still remain in attaining even thin-film growth due to tendency of viscous gases to flow toward areas of lower pressure, which herein is the gas outflow opening in the reaction space. It is an object of the present invention to overcome the drawbacks of conventional technology and to provide an entirely novel equipment for growing homogeneous thin films.

SUMMARY OF THE INVENTION

The goal of the invention is achieved by virtue of placing the flow-homogenizing restriction, called the dominating point of restriction, after the substrates on the gas flow path. Then, viscous gas-phase precursor is advantageously brought to reside at a higher pressure in the reaction chamber over the substrate, or alternatively, two substrates, between the substrates, if the reaction chamber is formed by two substrates placed facing each other. In this arrangement the conductance cross-directionally to the gas flow is larger than the conductance over restriction channel to the gas drain. By virtue of thus equalizing the pressure in space between the substrates, concentration gradients are eliminated provided that the inflowing gas is homogeneous.

The method according to the invention can be implemented advantageously in an equipment having a cassette-like reaction chamber pack construction. Herein, the reaction space is comprised of planar elements with a design permitting vertical (or horizontal) stacking. At least a number of said elements are mutually identical. In the assembly of the cassette-like pack, the substrate is placed horizontal onto the modular element in a holder recess formed in the element. The inflow channels of reactants and outflow channels of gaseous reaction products and excess reagents are provided by vertical channels formed remaining in the ready-assembled cassette pack when the substrate plane is oriented horizontal. The substrate holder recess is connected to the outflow channel via a threshold designed between the recess and the outflow channel. This threshold then forms a narrow slit in a plane parallel to the substrate in the ready-assembled cassette pack, whereby the slit acts as a restriction for the gas outflowing from the reaction chamber.

In the context of the present invention, the term "reactant" refers to a vaporizable material capable of reacting with the substrate surface. In the ALE method, reactants belonging in two different groups are conventionally employed. The reactants may be solids, liquids or gases. The term "metallic reactants" is used of metallic compounds which may even be elemental metals. Suitable metallic reactants are the halogenides of metals including chlorides and bromides, for instance, and metal-organic compounds such as the thd complex compounds. As examples of metallic reactants may be mentioned Zn, $ZnCl_2$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia.

In the present context, the term "inactive" gas is used to refer to a gas which is admitted into the reaction space and is capable or preventing undesired reactions related to the reactants and the substrate, respectively. Such reactions include the reactions of the reactants and the substrate with possible impurities, for instance. The inactive gas also serves for preventing reactions between the substances of the different reactant groups in, e.g., the inflow piping. In the method according to the invention, the inactive gas is also used advantageously as the carrier gas of the vapor-phase pulses or the reactants. According to a preferred embodiment, in which the reactants of the different reactant groups are admitted via separate inlet manifolds into the reaction space, the vapor-phase reactant pulse is admitted from one inflow channel while the inactive gas is admitted from another inflow channel, where the stream of the inactive gas prevents the admitted reactant from entering the inflow channel of another reactant. Of inactive gases suited for use in the method, reference can be made to inert gases such as nitrogen gas and noble gases, e.g., argon. The inactive gas may also be an inherently reactive gas such as hydrogen gas serving to prevent undesirable reactions (e.g., oxidization reactions) from occurring on the substrate surface.

According to the invention, the term "reaction space" includes both the space in which the substrate is located and in which the vapor-phase reactants are allowed to react with the substrate in order to grow thin films (namely, the reaction chamber) as well as the gas inflow/outflow channels communicating immediately with the reaction chamber, said channels serving for admitting the reactants into the reaction chamber (inflow channels) or removing the gaseous reaction products of the thin-film growth process and excess reactants from the reaction chamber (outflow channels). According to the construction of the embodiment, the number of the inflow and outflow channels, respectively, can be varied from one upward. The inflow/outflow channels may also be located to the opposite ends of the substrate, whereby an outflow channel for one reactant is located at the same end with the inflow channel of another reactant, advantageously separated from the latter by means of a baffle (refer to the embodiment illustrated in FIG. 3). Thus, the gas-phase reactants can be fed onto the substrate alternately from opposite directions. This arrangement is capable of compensating for the higher film growth rate typically occurring at the inflow end of the substrate. Then, also the evacuating vacuum applied to the outflow channel is arranged to occur alternately from opposite directions.

Herein, the term "substrate surface" is used to denote that top surface of the substrate on which the vapor-phase reactant flowing into the reaction chamber first impinges. In practice, said surface during the first cycle of the thin-film growing process is constituted by the surface of the substrate such as glass, for instance; during the second cycle the surface is constituted by the layer comprising the solid-state reaction product which is deposited by the reaction between the reactants and is adhered to the substrate, etc.

According to the invention, the flow passing over the individual substrates is principally controlled by the restriction at the outflow end of the reaction chamber. To better equalize the flow, flow restriction may also be arranged to the inflow end of the substrates and even so that the dominating point of restriction is arranged at the substrates themselves. In the latter case, the substrates are located in the reaction chambers so as to make the space remaining between their surface and the opposite wall (e.g., the surface of another substrate) act as a restriction for the gas flow through the reaction chambers.

To achieve homogeneous thin-film growth, in the embodiment according to the invention it has been found essential to performed the homogenizing steps of the reagent gas mixture and its flow separately from each other. These homogenizing steps represent two different steps which in principle are separate even if they might be implemented using a single structural component. In prior-art embodiments, only the homogenization of gas flow has been attempted. Homogenization will be described in greater detail below.

According to the invention, the thin-film growth equipment is divided into at least three zones: gas homogenization zone, reaction zone between substrate and reactants and gas flow restriction zone. Of these zones, the homogenization zone is typically located prior to the reaction zone, or in conjunction thereof, and the flow restriction zone is placed subsequent to the reaction zone, or alternatively, is divided into one section preceding the reaction zone and another section following the reaction zone.

Advantageously, the equipment according to the invention is run so that the inactive gas dilutions causing concentration differences are minimized in order to reduce the homogenization problems. This notwithstanding, it has been found advantageous to provide the equipment with a homogenization zone in which the gas mixture of the vaporized reactant and the inactive gas is homogenized. While the homogenization zone may be located in the substrate holders of the equipment, wherein it is formed by the gas flow restriction points before the substates, it can as well be placed as a separate component in conjunction with the source group, or alternatively be implemented by designing the piping structure in a way promoting the homogenization of the gas mixture.

As an example of a homogenization zone located in the substrate holders, the embodiment described in the following may be mentioned as particularly suited for cases using at least two compound reactant constituents for growing the thin film.

Herein, each reactant group is fed via its individual inflow channel directly into the reaction chamber Prior to contacting the reactant with the substrate, it is allowed to undergo mixing and homogenization with an inactive gas flow entering from the inflow channel of the other reactant group. The entrance openings of the inflow channels of the different reactant groups, later in the text referred to as the reactant "infeed openings", are here taken into the reaction chamber close to the substrate for the thin-film growth. Between the infeed openings is adapted a baffle capable of preventing the reactant flow entering from one inflow channel from directly impinging on the inflow channel of the other reactant group. To eliminate the risk of contamination herein, inactive gas is advantageously passed through the inflow channel not being used at the time for the infeed of a reactant. The reactant infeed openings are disposed on the opposite sides of the baffle and the inflows of the reactants are directed perpendicularly against the baffle, whereby the gas flow can be spread into an essentially planar flow producing a "flattened" flow pattern. The carrier gas flow and the vapor-phase reactant flow entering from the opposite directions, respectively both flows becoming flattened when hitting the baffle, are combined prior to taking their mixed flow into contact with the substrate. All surfaces of the cassette structure are kept at the reaction temperature.

The above-outlined embodiment will be examined in greater detail in conjunction with the description of FIG. 3.

It has been found that material transport by diffusion is extremely efficient between the flattened gas flows and thus the gas introduced to the substrate becomes particularly uniform in both its composition and flow.

Alternatively, the homogenization zone may be located prior to the reaction chamber. Shown in FIG. 2 is an embodiment in which the gas flow containing the vapor-phase reactant is homogenized, together with a possible inactive gas flow, in an infeed opening exiting into the reaction space byway of making the flows to impinge on a baffle, whereby the flows are flattened in the above-described fashion assuming a planar flow pattern. This shaped flow is then taken via an elongated inflow channel with a narrow slitted cross section into the reaction chambers.

Generally, a gas flow may be flattened in a desired section of the equipment according to the invention by virtue of allowing a flow passing through a circular channel to impinge on a baffle oriented perpendicularly to the flow. Such a baffle may have machined thereto a fanned slit exiting in a defined direction, whereby the impinging flow is taken into the slit. Next, the initially flattened flow is taken into a typically flat gas inflow channel or a flat reaction chamber. On the inflow side of the reaction chamber, the gases are caused to flow via a 90° bend in conjunction with the flow flattening, whereby the combination of the bend and the gas flow impingements associated therewith enhance the cross-directional homogenization of the flow.

Accordingly, the flow pattern must first be made uniform with respect to concentrations in, e.g., the base plate of the reaction chamber pack, after which it is flattened so as to eliminate cross-directional concentration differences (that is, lateral pressure gradients). Subsequently, this flat gas flow front is distributed into the in-parallel connected reaction chambers. Finally, within each reaction chamber suitable arrangements must be made to ensure uniform travel of the gas front over the substrates. The in-parallel connected restrictions provided by the narrow reaction chambers and their inflow and outflow restrictions serve to divide the total gas flow uniformly between the individual reaction chambers. Therein, the inherent flow restriction of the reaction chamber in conjunction with and inflow and outflow restrictions in turn serves to ensure the uniformity of the flow passing through each chamber.

The goal is to ensure a uniform gas flow through the reaction zone. By forming the reaction chamber narrow (that is, having a small free height above the substrate relative to the cross-directional width of the chamber), the gas flow can be prevented from assuming any cross-directional concentration profile in the reaction chamber. Particularly advantageously the reaction chamber surrounding the substrate is designed to have its broad walls disposed close to the substrate being processed. The top wall of the chamber is advantageously aligned parallel to the top surface of the underlying substrate.

By forming the infeed openings of the reaction chamber slit-like, the flow is prevented from forming a pressure gradient in the inside of the reaction chamber. Then, the reactant constituents of the thin-film growth process are distributed uniformly over the entire width of the substrate without the occurrence of any cross-directional concentration profile.

The process-controlling flow restriction, that is, the outflow restriction following the substrate on the gas flow path, can be designed as separate element, or alternatively, integrated as a portion of the planar substrate holder element in the ready-assembled cassette pack construction. Both the metallic and nonmetallic precursors can be fed through separate flow restrictors, whereby the flow rate in the restrictors can be dimensioned so that the flow in the restrictor acts as an isolating flow forming a chemical barrier between the inflow pipings from the sources of the different reagent groups.

According to a preferred embodiment, the flow restriction is implemented as a narrow exhaust suction slit formed between the outflow channel to the vacuum source (e.g., a vacuum pump) and the reaction chamber. Such a suction slit may be formed by either a single, contiguous slit or a plurality of small, parallel slits which in the exit direction of the flow is/are preceded by the large-volume reaction chamber having a larger relative flow conductance than that of the slit(s).

Advantageously, the equipment according to the invention comprises vertically or horizontally stacked planar elements, whereby said elements have recesses/grooves corresponding to the reaction chambers and gas flow channels machined to them and at least a number of said elements are mutually identical. The reaction chambers are formed as flat spaces between the vertically or horizontally stacked planar elements. The edge areas of the planar elements are provided with round, or alternatively, oblong notches or openings extending through the planar element and forming said gas flow channels of said reaction space as ducts oriented perpendicular to the plane of the reaction chambers when said planar elements are stacked vertically or horizontally in order to form a reaction chamber pack. The number of such round openings on the reactant inflow side is advantageously one per each reactant group, which in practice means two openings. The number of oblong openings required on the inflow side is only one.

The center parts of the planar elements can be provided with areas recessed from the plane of the element so that the recessed areas are connected at their reactant inflow and outflow sides, respectively, to said notches or openings. These recessed areas form the reaction chamber of the reaction space, or a portion thereof. The recessed areas of the element may be made so deep as to extend through the entire thickness of the planar element leaving the center of the element open. Advantageously, the inner edges of the recessed areas conform along at least two opposite sides of the recess to the edges of the substrates, thus permitting the location of the substrates in the recesses. When desired, the inner edges of the recesses can be provided with brackets serving to support the substrate. In the latter case the broad walls of the reaction chamber pack are formed by substrates placed into the center openings of the planar elements, whereby the substrates may be aligned so as to, e.g., have the substrate top sides facing each other.

The cassette-like pack of planar substrate holder elements incorporates a gas leak shield implemented by providing the surface of the planar elements, close to the edges of the element, with an encircling suction groove for collecting any gas leaks. The suction groove communicates with the outflow channel in which a vacuum prevails. The purpose of the suction groove is to avoid the access of external contamination into the reaction space, and vice versa, to prevent reactants from leaking outside the reaction space. The isolating flow in the suction groove provides optimum shielding effect if the maximum restriction of reaction product gas flow is arranged to occur at the outflow end of the substrate, close to the outflow channel.

The parts of the cassette pack construction are made from a material which is inert with respect to reactants used in the ALE process. Preferred materials are glass and similar silicate-based compounds and different kinds of ceramic materials.

The arrangement according to the invention provides significant benefits over conventional ALE reactors. For instance, as the gas distribution onto the substrate surfaces is more uniform, a smaller degree of overdosing can be used thus achieving savings in the consumption of precursors and process time. Also the quality of produced thin films is improved.

The above-described novel solutions of equipment construction make it possible to reduce the weight of the reaction space structures and minimize the number of elements in the equipment. The horizontally or vertically stacked pack of reaction chambers offers shorter lengths of inflow and outflow channels, respectively. This is particularly true for the last of the above-described embodiments, in which the substrates perform as both the walls of the reaction chambers and the intermediate walls between the reaction chambers.

BRIEF DESCRIPTION OF THE FIGURES

In the following the details and benefits of the invention will be evident from the description given below in greater detail with reference to the appended drawings in which.

DETAILED DESCRIPTION OF THE PREFERRED EMBODIMENTS

Figure 1:
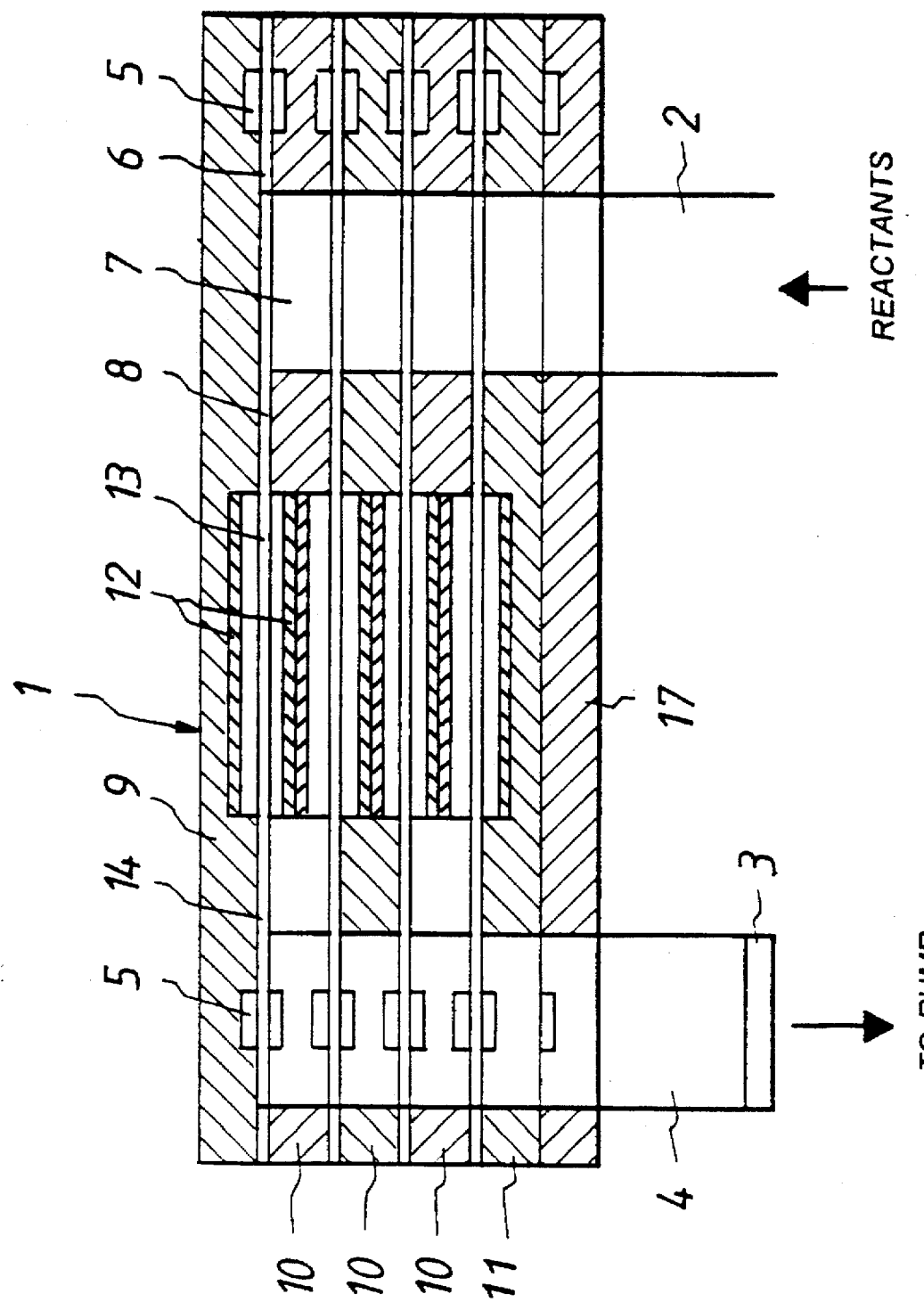
FIG. 1 is a longitudinally sectioned side view of a simplified structure for the reaction chamber pack in a first embodiment according to the invention.

Referring to FIG. 1, the equipment construction shown therein comprises a reaction space, or a reaction chamber pack 1, assembled from mutually identical, stacked planar elements 10, in which pack the gas flow channels 7, 4 and reaction chambers 13 are formed by openings and notches made to the planar elements. The equipment is shown to incorporate four reaction chambers 13 having placed therein eight substrates 12 onto which thin films are grown using the ALE process. Reference numeral 3 denotes the connection of the reaction chamber pack to a pipe communicating with the inlet of a pump. The connection communicates with the outflow channel 4 of vapor-phase reaction products and excess reactants, whereby the outflow channel acts as collecting manifold for the outflows from the reaction chambers. Correspondingly, reference numeral 2 denotes the inflow opening for vapor-phase reactants, whereby said inflow opening further communicates with the reactant inflow channel 7.

The planar elements are provided with an encircling suction groove 5 for collecting any gas leaks. The suction groove communicates with the outflow channel 4. The purpose of the suction groove is to avoid the access of external contamination into the reaction space and to prevent reactants from leaking outside the reaction space. Thus, the groove acts as an isolating gas seal for the reaction space.

When stacking the planar elements, between each two superimposed elements is placed an intermediate plate 6 with a purpose to determine the restriction of the gas flow by setting the cross section of the inlet slit 8 from the inflow channel 7 into the reaction chamber 13 and the cross section of the outlet slit, that is, gas flow restriction, from the reaction chamber to the outflow channel 4.

The upper half of the uppermost reaction chamber acts as the top plate 9 of the reaction chamber pack, and correspondingly, the lower half of the lowermost reaction chamber acts as the bottom plate 11, which is mounted onto a support base 17. Between said top plate and bottom plate are stacked three mutually identical planar elements 10. Each planar element forms firstly in combination with the substrate 13 the wall between two adjacently stacked reaction chambers, and secondly, in combination with the intermediate plates 6 and other auxiliary plates, forms the inflow and outflow channels 7, 4. The number of the planar elements may be varied in the range 0-100 pcs.

The inflow/outflow channels 7, 4 and the reaction chambers are shaped to have longitudinally a narrow, oblong cross section to facilitate a "flattened" gas flow and minimize the volume of the reaction space.

In the embodiment illustrated in FIG. 1, the vapor-phase reactant pulses of different reactant groups are ted alternately into the inflow channel 7. Prior to the feed, the gas inflow pulses are homogenized with an inactive gas flow in the inflow channel 7 or before. In the inflow channel, shown longitudinally sectioned in the diagram, the vapor-phase reactant pulse travels flattened into a planar shape which proceeds along the channel with a defined leading front. The flow front has a width equal to that of the substrate, which is approx. 10–30 cm, for instance, while the thickness of the front is approx. 1–3 cm.

The flow travelling in the inflow channel is distributed evenly between the inparallel stacked reaction chambers 13 by dimensioning the reaction space with its gas flow restrictions so that the flow conductance of the inflow channel 7 is much higher than the flow conductance via the reaction chambers 13. The flow path through each reaction chamber must have a conductance which is equivalent (equal) to that of the gas paths via the other chambers. Then, the gas pressure and flow rate are balanced between the individual reaction chambers, and thus, the thin film growth rate is also equal in the separate chambers. Inside the reaction chamber 13, the flow pattern is equalized by virtue of the narrow suction slit 14 formed to the outflow end of the reaction chamber so as to act as a gas flow restriction. As the conductance of a slit is proportional to the third power of the spacing, typically in the order of 0.1–2 mm, between its broad walls and as the longitudinal dimension of the slit is at least equal to the shorter edge of the substrates being processed (e.g., 6", 8"or 12"), the manufacturing tolerance requirements for the slit are extremely tight. Because the manufacture of such narrow slits is complicated and expensive, the suction slit 14 may also be formed by a plurality of smaller, parallel slits supported by narrow isthmuses between them. Then, the gas flow tends to exit via the slit(s) in an equally distributed pattern. In the reaction chamber 13 this is manifested as an equalized cross-directional pressure gradient of the leading edge of the propagating gas pulse meaning a uniformly propagating gas front. In underdose-limited reagent depletion tests (with reduced reactant dosing), the gas front has been found to have an extremely straight contour.

Ensuring the equalized cross-directional outflow pattern of gas front is extremely important, because the gas molecules tend to travel toward the direction of lowest pressure (most effective suction), whereby the straight gas front will be distorted if subjected to a nonhomogeneous suction. Moreover, a uniform suction effect will rectify a gas front distorted due to other possible reasons.

After the exit of the vapor-phase reactants from the reaction chamber and particularly the reaction space, their possible mixing no matter how complete will not cause harm to the thin film being grown.

In the embodiment shown in FIG. 1, restrictions are provided on the path of the gas flow both before the substrates (8) and after them (14). This arrangement can ensure an extremely homogeneous flow over the substrates.

Figure 2:
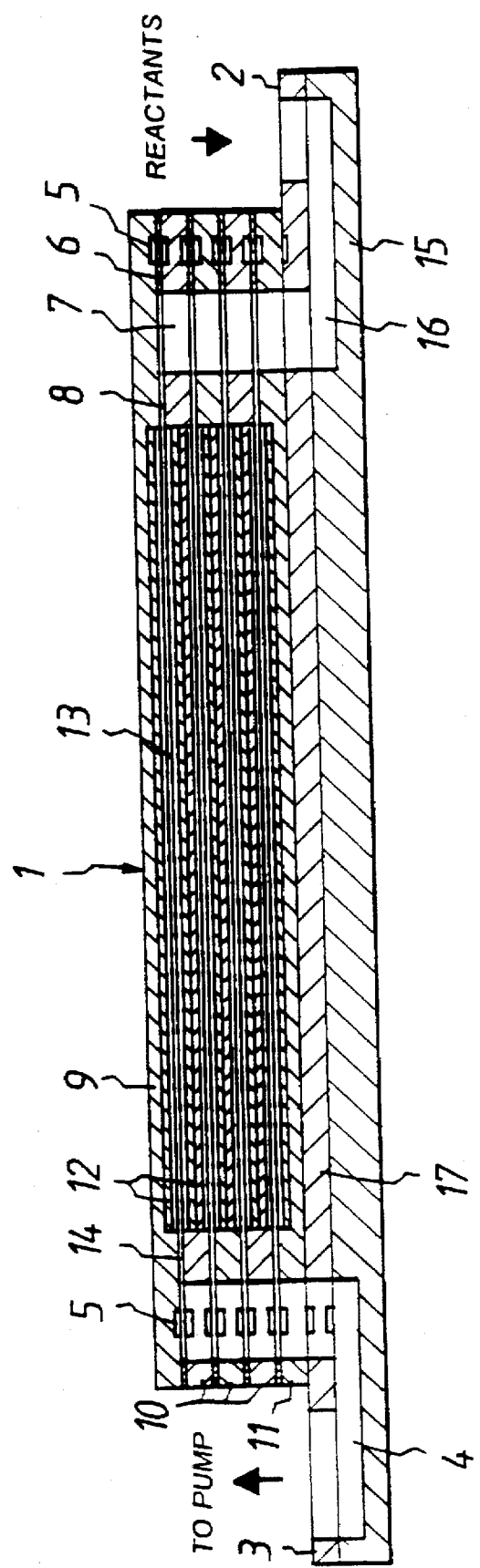
FIG. 2 is a side view of the first embodiment shown in FIG. 1, now mounted on a support base.

Now referring to FIG. 2, the above-described cassette pack construction is shown assembled onto a support base 15. In the support base is formed a gas inflow channel 16 for the gas being introduced into the reaction space. When impinging on the wall of the support base channel, the vapor-phase reactant pulse mixed with inactive gas assumes a flattened flow pattern propagating with a sharply defined leading front. Also here, the width of the flow is approximately equal to the width of the substrate. Via the inflow channel the gas flow is next taken in the above-described fashion into the reaction chambers.

The essential detail in the embodiment illustrated in FIG. 2 is that the gas flow is homogenized during its feed into the reaction space prior to taking the flow as a flattened, planar flow into the reaction chambers.

Figure 3:
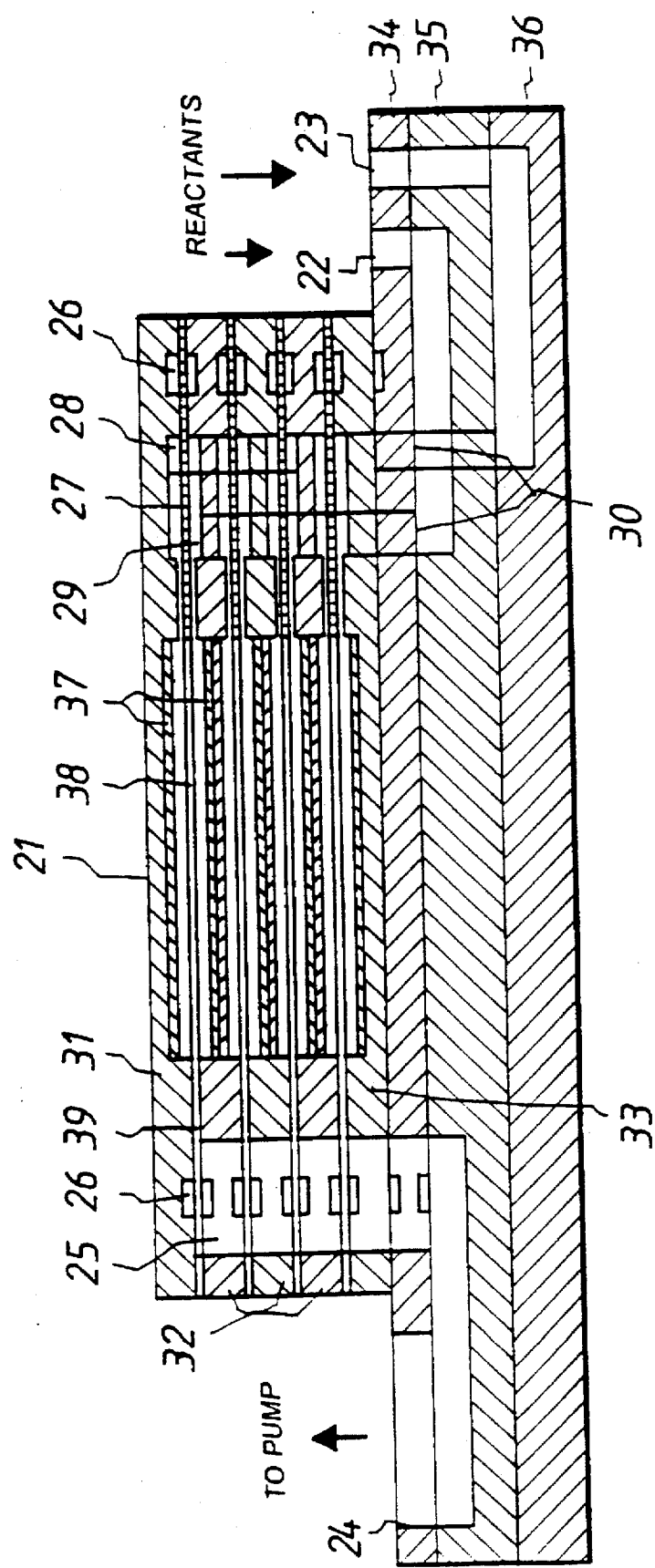
FIG. 3 is a longitudinally sectioned side view of a simplified structure for the reaction space construction in a second embodiment according to the invention.

Referring to FIG. 3, an embodiment slightly different from that described above is shown. The legend of reference numerals in the diagram is as follows:

21. Reaction chamber pack
22. Inflow duct opening for precursors of group A
23. Inflow duct opening for precursors of group B
24. Connection for pipe communicating with suction inlet of pump
25. Collecting outflow channel lot outflow slits from in-parallel stacked reaction chambers
26. Suction groove encircling the planar element for collection of possible gas leaks, whereby the suction groove communicates with the collecting outflow channel.
27. Intermediate plate serving for setting of outflow slit height, that is, gas flow restriction. In addition to its function as setting the outflow restriction, the intermediate plate forms a baffle separating the different precursor groups at the inflow side.
28. Inflow channel for precursors of group B
29. Inflow channel for precursors of group A
30. Inflow channels serving for the distribution of the precursor flows to the paralleled reaction chambers
31. Top plate and one half of the uppermost reaction chamber
32. 0–100 pcs. identical planar elements. Each planar element in combination with the substrate forms the separating wall between two superimposed reaction chambers as well as the inflow and outflow channels in combination with the intermediate plates and the other auxiliary plates.
33. Bottom plate and one half of the lowermost reaction chamber
34. Uppermost plate of support base
35. Middle plate of support base
36. Lowermost plate of support base
37. Substrates
38. Reaction chamber
39. Slit acting as restriction for gas flow leaving the substrate.

The embodiment shown in FIG. 3 is used in the same fashion as that illustrated in FIG. 1. However, this construction differs from first embodiment in that the precursors of different reactant groups are taken along their own inflow channels up to the inflow slits of the reaction chambers. Hence, the reaction chamber pack is assembled onto such a support base plate set 34–36 which after their stacking provide individual flow ducts 22, 23 for the reactants of the different precursor groups. Similarly, the reactants travel in their individual inflow channels 28, 29 at the side of the reaction chamber pack.

The gases am fed from the inflow channels 28, 29 separated by the baffles 27 formed by the intermediate plates, whereby the height of the reaction chamber is dimensioned so that interdiffusion performs efficient mixing of the flows entering from the different channels. While diffusion is a too slow mixing method to be used in the width direction of the flattened gas flow pattern, it performs well in the height direction. Thus, when the reactant is fed from one inflow channel 28, for instance, the inactive gas is fed from the other channel 29. When impinging on the baffles, the reactant and inactive gas flows, respectively, are flattened assuming a planar flow pattern, whereby they are homogenized during their intermixing in the inflow slit of the reaction chamber.

The inflow ducts 22, 23 and the inflow channels 28, 29 may have a circular cross section, for instance, and the reactant gas flows are spread into a fanned and flattened shape only at the baffles. Also a greater number of inflow channels can be provided for each reactant group, whereby reactant flow through each channel impinges only on a portion of the substrate.

Still referring to FIG. 3 showing the longitudinally sectioned side view of the equipment, it must be noted that both inflow channels are drawn therein. However, in a practical embodiment, these inflow channels are arranged in parallel so that their exit openings are at the same distance from the substrate, whereby in a side view true to the reality, only the channel closer to viewer would be shown, with the other channel remaining concealed behind the former.

Analogously with the first embodiment, securing the equalized cross-directional outflow pattern of the gas front is extremely important also in the above-described embodiment. Inside the reaction chamber 38 the flow pattern is equalized by means of a narrow suction slit 39 formed to the outflow end of the chamber so as to perform as a flow restrictor.

EXAMPLE

The following example describes the design principles for an equipment according to the invention for growing thin films:

Substrate size 300×300 mm$^2$

Number of substrates 10 pcs.

Number of reaction chambers 5 pcs.

Spacing between substrates 4 mm

Total volume of reaction chambers 5×300×300×4 mm$^3$= 18,000 cm$^3$

Dimensions/volume of inflow channels 300×10×100 mm=300 cm$^3$

Dimensions/volume of outflow channels 300×10×100 mm=300 cm$^3$

Total volume 18,600 cm$^3$, or approx. 19 l.

The pump capacity is selected as 360 m$^3$/h, or 360×1000/ 3600 (l/s)=100 l/s. The interval between the reactant pulses should be at least approx. 0.25 s or longer.

What is claimed is:

1. An apparatus for growing thin films onto a substrate by subjecting the substrate to alternately repeated surface reactions of vapor-phase reactants to form a solid-state thin film on the substrate, said apparatus comprising:

a reaction space into which the substrate is disposed, said reaction space having a reaction chamber formed therein;

a plurality of inflow channels communicating with said reaction space, said inflow channels being suited for feeding the reactants employed in a thin-film growth process into said reaction space; and a plurality of outflow channels communicating with said reaction space, said outflow channels being suited for the outflow of reaction products and excess amounts of reactants from said reaction space, wherein the apparatus comprises a plurality of vertically or horizontally stacked planar elements, of which at least two are mutually identical, and in which said reaction chamber is machined and said inflow and outflow channels are formed.

2. The apparatus of claim 1, wherein the apparatus comprises at least two reaction chambers for growing at least two thin films simultaneously.

3. The apparatus of claim 1, wherein the edges areas of said plurality of planar elements have openings formed therein, said openings being perpendicular to the plane of said respective planar element, said openings extending through said respective planar element and forming said inflow and outflow channels of said reaction space when said planar elements are stacked vertically or horizontally.

4. The apparatus of claim 3, wherein the center areas of said plurality of planar elements have recesses formed therein, said recesses being formed in the plane of said planar elements, wherein said recesses form said reaction chamber of said reaction space when said planar elements are stacked vertically or horizontally.

5. The apparatus of claim 4, wherein said plurality of planar elements, when stacked vertically or horizontally, provide in the spaces formed by said recesses and said openings, at least one narrow slit acting as a gas flow restricter for said gas flow passing through said reaction space.

6. The apparatus of claim 5, wherein said gas flow restricter is comprised of a plurality of parallel slits.

7. The apparatus of claim 5, wherein said narrow slit is formed in a wall area of said planar elements disposed between said recesses and said openings.

8. The apparatus of claim 5, wherein a plurality of adaptable intermediate planar elements are disposed between said vertically or horizontally stacked planar elements, said intermediate planar elements having a thickness corresponding to the desired height said slit acting as said gas flow restricter in said reaction space.

9. The apparatus of claim 4, wherein said recesses are extended through the entire thickness of said planar element forming in said planar elements a central opening in which the substrate can be located.

10. The apparatus of claim 9, wherein the sides of said central opening of said planar element comprise projecting brackets configured to hold the substrate.

11. The apparatus of claim 9, wherein in said reaction space formed from said vertically or horizontally stacked planar elements, the broad walls of said reaction chamber are formed by a plurality of substrates adapted to the central openings of said planar elements.

12. The apparatus of claim 1, further comprising an encircling suction groove disposed in the surface of and close to the edges of said planar elements, said suction groove used to collect any gas leaks to provide an inactive gas shield.

13. The apparatus of claim 12, wherein said suction groove is adapted to communicate with said outflow channel.

14. The apparatus of claim 1, wherein said vertically or horizontally stackable planar elements are designed for assembly on a support base incorporating a gas inflow channel for the gas to be introduced into said reaction space, said gas inflow channel designed to allow the gas flow to be homogenized therein.

15. The apparatus of claim 1, wherein the number of vertically or horizontally stackable planar elements is between 2 and 100.

16. The apparatus of claim 1, wherein the apparatus comprises at least two of said inflow channels and at least two of said outflow channels, and wherein said inflow channels and said outflow channels are disposed to the opposite ends of the substrate, whereby the opening of one of said outflow channels for one reactant group is disposed at the same end of the substrate as the opening of one of said inflow channels for another reactant group, and vice versa.

17. The apparatus of claim 16, wherein vapor-phase pulses can be fed onto the substrate alternately from opposite directions.

* * * * *